(12) United States Patent
Shahine

(10) Patent No.: US 7,505,496 B2
(45) Date of Patent: Mar. 17, 2009

(54) SYSTEMS AND METHODS FOR REAL-TIME COMPENSATION FOR NON-LINEARITY IN OPTICAL SOURCES FOR ANALOG SIGNAL TRANSMISSION

(75) Inventor: Michael H. Shahine, Ellicott City, MD (US)

(73) Assignee: Ciena Corporation, Linthicum, MD (US)

(*) Notice: Subject to any disclaimer, the term of this patent is extended or adjusted under 35 U.S.C. 154(b) by 0 days.

(21) Appl. No.: 11/398,107

(22) Filed: Apr. 5, 2006

(65) Prior Publication Data

US 2007/0237194 A1  Oct. 11, 2007

(51) Int. Cl.
*H01S 3/00* (2006.01)

(52) U.S. Cl. ............... 372/38.01; 372/38.1; 372/38.02; 398/192; 398/195; 324/767; 356/485

(58) Field of Classification Search ............... 372/38.1, 372/38.01, 38.02; 398/192, 195; 324/767; 356/485
See application file for complete search history.

(56) References Cited

U.S. PATENT DOCUMENTS

| | | | |
|---|---|---|---|
| 4,873,690 A | 10/1989 | Adams | |
| 4,924,470 A | 5/1990 | Ries | |
| 5,012,484 A | 4/1991 | Flynn et al. | |
| 5,111,475 A | 5/1992 | Ackerman et al. | |
| 5,208,824 A | 5/1993 | Tsang | |
| 5,252,839 A | 10/1993 | Fouquet | |
| 5,285,468 A | 2/1994 | Ackerman et al. | |
| 5,311,005 A | 5/1994 | Visocchi | |

(Continued)

OTHER PUBLICATIONS

Charles Cox III, Edward Ackerman, Roger Helkey, Gary E. Betts; IEEE Transactions On Microwave Theory and Techniques, vol. 45, No. 8, Aug. 1997; "Techniques and Performance of Intensity-Modulation Direct-Detection Analog Optical Links"; Lexington, MA.

(Continued)

*Primary Examiner*—Minsun Harvey
*Assistant Examiner*—Yuanda Zhang
(74) *Attorney, Agent, or Firm*—Clements Bernard Miller; Christopher L. Bernard; Tyler S. Brown

(57) ABSTRACT

The present invention provides a compact analog directly modulated laser configuration that is suitable for use in the field that uses electrical feedback to compensate for non-linearity in real time, such that no matter how the LI curve changes, the electrical feedback compensates for non-linearity by amplifying a portion of the output analog optical signal and combining it with the input analog electrical signal using the standard control method of negative feedback. When the gain of the feedback loop is relatively high, the overall transfer function of the system is primarily dependent on the feedback loop gain block, which is substantially linear. This is accomplished by incorporating a relatively large bandwidth photo-detector at the back facet of the laser that both monitors the output power of the system and provides a feedback signal to the linearization control circuit, as well as an amplifier. The amplified signal from the relatively large bandwidth photo-detector is used to correct for various undesirable effects, such as non-linearity and relative intensity noise (RIN) of the laser. The signal from the relatively large bandwidth photo-detector also allows the laser to operate effectively close to threshold.

25 Claims, 3 Drawing Sheets

U.S. PATENT DOCUMENTS

| | | | |
|---|---|---|---|
| 5,321,710 A | 6/1994 | Cornish et al. | |
| 5,579,328 A | 11/1996 | Habel et al. | |
| 5,600,126 A | 2/1997 | Appel et al. | |
| 5,642,375 A | 6/1997 | King et al. | |
| 5,657,124 A * | 8/1997 | Zhang et al. | 356/485 |
| 5,659,414 A | 8/1997 | Appel et al. | |
| 5,684,623 A | 11/1997 | King et al. | |
| 5,724,088 A | 3/1998 | Genovese | |
| 5,835,121 A | 11/1998 | Genovese et al. | |
| 5,835,522 A | 11/1998 | King et al. | |
| 5,956,355 A | 9/1999 | Swanson et al. | |
| 5,963,570 A * | 10/1999 | Gnauck et al. | 372/38.01 |
| 6,124,956 A | 9/2000 | Severn | |
| 6,160,826 A | 12/2000 | Swanson et al. | |
| 6,192,058 B1 | 2/2001 | Abeles | |
| 6,347,107 B1 | 2/2002 | Roddy et al. | |
| 6,351,310 B1 | 2/2002 | Emge et al. | |
| 6,370,175 B1 * | 4/2002 | Ikeda et al. | 372/38.1 |
| 6,597,485 B1 * | 7/2003 | Ikeuchi et al. | 398/192 |
| 6,609,842 B1 * | 8/2003 | Kimbrough | 398/195 |
| 6,647,046 B1 | 11/2003 | Salvatore | |
| 6,724,793 B2 * | 4/2004 | Nagara | 372/38.02 |
| 6,778,570 B2 * | 8/2004 | Tanase | 372/38.02 |
| 6,865,199 B2 | 3/2005 | Miguelez et al. | |
| 6,907,055 B2 * | 6/2005 | Morley et al. | 372/38.1 |
| 6,917,639 B2 * | 7/2005 | Ishida et al. | 372/38.02 |
| 6,928,094 B2 * | 8/2005 | Asuri et al. | 372/38.02 |
| 6,937,780 B2 | 8/2005 | Alphonse | |
| 6,950,452 B2 | 9/2005 | Tsukiji et al. | |
| 7,085,296 B2 * | 8/2006 | Caldwell | 372/38.01 |
| 2003/0090289 A1 * | 5/2003 | Morley et al. | 324/767 |
| 2003/0193977 A1 * | 10/2003 | Tsai | 372/38.01 |
| 2004/0022284 A1 * | 2/2004 | Wang | 372/38.02 |
| 2005/0271100 A1 * | 12/2005 | Everett et al. | 372/38.02 |
| 2005/0271396 A1 | 12/2005 | Iannelli | |

OTHER PUBLICATIONS

Satheesan Nadarajah, Xavier N. Fernando, Rexa Sedaghat; CCECE 2003-CCGEI 2003, "Adaptive Digital Predistortion of Laser Diode Nonlinearity For Wireless Applications"; Department of Electrical and Electtronic Engineering, Ryerson University; Montreal.

Y. Chiu, B. Jalali, S. Garner, and W. Steier.; IEEE Photonics Technology Letters, vol. 11, No. 1, Jan. 1999; "Broad-Band Electronic Linearizer for Externally Modulated Analog Fiber-Optic Links".

Ram Sadwani, and Bahram Jalal with IEEE; Journal Of Lightwave Technology vol. 21, No. 12, Dec. 2003; "Adaptive CMOS Predistortion Linearizer for Fiber-Optic Links".

T. Ismail, C. P. Liu and A. J. Seeds; "Uncooled directly modulated high dynamic range source for IEEE802.11a wireless over fibre LAN applications": Proceedings of the Optical Fiber Conference (OFC), 2004, FE3.

Y. Chiu, B. Jalali, S. Garner, and W. Steier; "Broad-Band Electronic Linearizer for Externally Modulated Analog Fiber-Optic Links"; IEEE Photonics Technology Letters, vol. 11, No. 1, Jan. 1999; (c) 1999 IEEE. Los Angeles, CA.

* cited by examiner

SYSTEMS AND METHODS FOR REAL-TIME COMPENSATION FOR NON-LINEARITY IN OPTICAL SOURCES FOR ANALOG SIGNAL TRANSMISSION

FIELD OF THE INVENTION

The present invention relates generally to the analog optical source and transmission fields. More specifically, the present invention relates to systems and methods for real-time compensation for non-linearity in optical sources for analog (radio frequency (RF)) signal transmission and the like. The systems and methods of the present invention find applicability related to the distribution of voice transmission signals, video transmission signals, cable television (CATV) signals, wireless backhauling signals, cellular/personal communications system (PCS) signals, personal optical network (PON) signals, sensing signals, phased-array radar signals, and the like via analog optical links. The solution of the present invention can be applied to a variety of small form-factor (SFF) connector and small form-factor pluggable (SFP) modular optical transceiver packaging standards, including transmitter optical subassemblies (TOSAs), receiver optical subassemblies (ROSAs), and bi-directional transceiver packages.

BACKGROUND OF THE INVENTION

Analog optical signals can be generated using highly-linear directly modulated lasers, such as semiconductor lasers, laser diodes, and the like. In general, the characteristic curves (optical power in mW vs. injection current in mA) (LI curves) of these lasers must be substantially linear and curve or "kink"-free above a threshold current ($I_s$) at which lasing begins. Alternatively, analog optical signals can be generated using externally modulated lasers to compensate, to some extent, for any non-linearity. The overall requirement, using either modulation scheme, is that the generated analog optical signals closely match the input analog electrical signals, without significant distortion. In other words, slope variation compensation must be incorporated in order to maintain a relatively constant extinction ratio of the transmitted analog optical signals.

Non-linearity is caused by, among other things, temperature changes, age, internal parameters, and parasitics. Thus, the directly modulated lasers must be replaced regularly, likely as often as once every few months, as performance degradation occurs. Due to their relatively high cost, this becomes an expensive proposition. This problem is exacerbated by the fact that optical network elements are continually being deployed closer to end users. Thus, these optical network elements are being deployed in uncontrolled "field" environments. Currently, the only "outside-plant" rated components are transceiver-based components for digital communications, not analog communications. Similarly, the externally modulated lasers that compensate, to some extent, for non-linearity suffer from component complexity and are also relatively expensive.

Thus, what are needed are systems and methods for real-time compensation for non-linearity in optical sources for analog signal transmission and the like that minimize component complexity. By providing a correction factor for non-linearity due to temperature changes, age, internal parameters, parasitics, and the like, these systems and methods would eliminate the need for regular laser replacement, and thereby significantly reduce cost.

BRIEF SUMMARY OF THE INVENTION

In various exemplary embodiments, the present invention provides a compact analog directly modulated laser configuration that is suitable for use in the field that uses electrical feedback to compensate for non-linearity in real time, such that no matter how the LI curve changes, the electrical feedback compensates for non-linearity by amplifying a portion of the output analog optical signal and combining it with the input analog electrical signal using the standard control method of negative feedback. When the gain of the feedback loop is relatively high, the overall transfer function of the system is primarily dependent on the feedback loop gain block, which is substantially linear. This is accomplished by incorporating a relatively large bandwidth photo-detector at the back facet of the laser that both monitors the output power of the system and provides a feedback signal to the linearization control circuit, as well as an amplifier. The amplified signal from the relatively large bandwidth photo-detector is used to correct for various undesirable effects, such as non-linearity and relative intensity noise (RIN) of the laser. The signal from the relatively large bandwidth photo-detector also allows the laser to operate effectively close to threshold.

In one exemplary embodiment of the present invention, a system for real-time compensation for non-linearity in an optical source for analog signal transmission includes a laser device including a front facet and a back facet, wherein the laser device is operable for receiving a modulated input current and generating an optical output signal; a photo-detector device disposed adjacent to the back facet of the laser device, wherein the photo-detector device is operable for measuring the optical output power of the laser device; and a feedback correction loop coupled to the photo-detector device, wherein the feedback correction loop is operable for generating a substantially linear feedback current; wherein an input current is modified by the substantially linear feedback current to form the modulated input current. The back facet includes a partially reflective mirror. The modulated input current includes a substantially linear modulated input current. The photo-detector device includes a photo-detector device including a bandwidth of between about 100 MHz and about 20 GHz. Optionally, the feedback correction loop includes a negative feedback correction loop. The feedback correction loop includes an amplifier. A gain of the input current is about 0 dB, a gain of the substantially linear feedback current is about 60 dB (electrical gain), and a gain of the modulated input current is about 0 dB. If a laser device transfer function=X, a feedback correction loop transfer function=Y, an overall system transfer function=Z, $Z=X/(1+XY)$, and Y, being, by nature, substantially linear, is amplified such that $Y>>1$, then $Z=1/Y$ and is substantially linear. The laser device includes one of a semiconductor laser and a laser diode. Finally, the modulated input current includes an analog modulated input current.

In another exemplary embodiment of the present invention, a method for real-time compensation for non-linearity in an optical source for analog signal transmission includes providing a laser device including a front facet and a back facet, wherein the laser device is operable for receiving a modulated input current and generating an optical output signal; providing a photo-detector device disposed adjacent to the back facet of the laser device, wherein the photo-detector device is operable for measuring the optical output power of the laser device; and providing a feedback correction loop coupled to the photo-detector device, wherein the feedback correction loop is operable for generating a substantially linear feedback current; wherein an input current is modified by the substantially linear feedback current to form the modulated input current. The back facet includes a partially reflective mirror. The modulated input current includes a substantially linear modulated input current. The photo-detector device includes a photo-detector device including a bandwidth of between about 100 MHz and about 20 GHz. Optionally, the feedback correction loop includes a negative feedback correction loop. The feedback correction loop includes an amplifier. A gain of the input current is about 0 dB, a gain of the substantially linear feedback current is about 60 dB (electrical gain), and a gain of the modulated input current is about 0 dB. If a laser device transfer function=X, a feedback correction loop transfer function=Y, an overall system transfer function=Z, Z=X/(1+XY), and Y, being, by nature, substantially linear, is amplified such that Y>>1, then Z=1/Y and is substantially linear. The laser device includes one of a semiconductor laser and a laser diode. Finally, the modulated input current includes an analog modulated input current.

In a further exemplary embodiment of the present invention, a method for real-time compensation for non-linearity in an optical source for analog signal transmission includes providing a modulated input current to a laser device; wherein the modulated input current includes an input current having a relatively low gain and a substantially linear feedback current having a relatively high gain. The substantially linear feedback current is derived from a feedback correction loop. Optionally, the feedback correction loop includes a negative feedback correction loop. The feedback correction loop includes an amplifier. The substantially linear feedback current is derived from a feedback correction loop and a photo-detector device. The photo-detector device is disposed adjacent to a back facet of a laser device, wherein the photo-detector device is operable for measuring the optical output power of the laser device. Finally, the gain of the input current is about 0 dB and the gain of the substantially linear feedback current is about 60 dB (electrical gain).

Advantageously, the compact analog directly modulated laser configuration of the present invention can be deployed side-by-side in the field with transceiver-based components for digital communications.

BRIEF DESCRIPTION OF THE DRAWINGS

The present invention is illustrated and described herein with reference to the various drawings, in which like reference numbers denote like system components and/or method steps, as appropriate, and in which.

DETAILED DESCRIPTION OF THE INVENTION

Figure 1:
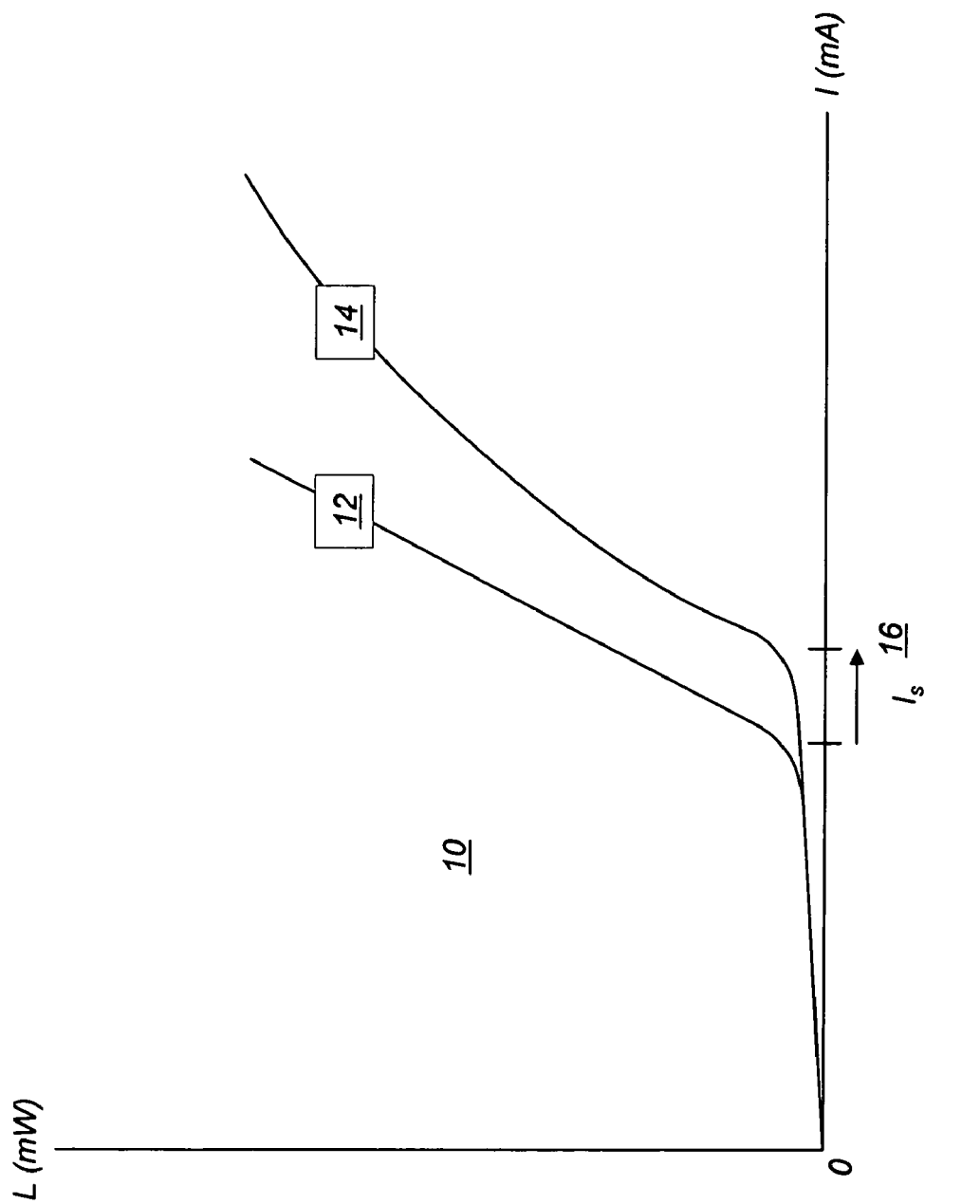
FIG. 1 is a graph illustrating the characteristic curves (optical power in mW vs. injection current in mA) (LI curves) associated with a given laser and the effect of temperature changes, age, internal parameters, and/or parasitics on the linearity of these curves (i.e. the non-linearity problem associated with analog optical transmission)

As described above, analog optical signals can be generated using highly-linear directly modulated lasers, such as semiconductor lasers, laser diodes, and the like. In general, the characteristic curves 10 (FIG. 1) (optical power in mW vs. injection current in mA) (LI curves) of these lasers must be substantially linear and curve or "kink"-free above a threshold current 16 (FIG. 1) ($I_s$) at which lasing begins. Referring to FIG. 1, for example, a substantially linear characteristic curve 12 and a substantially non-linear characteristic curve 14 above $I_s$ 16 are illustrated. Alternatively, analog optical signals can be generated using externally modulated lasers to compensate, to some extent, for any non-linearity. The overall requirement, using either modulation scheme, is that the generated analog optical signals closely match the input analog electrical signals, without significant distortion. In other words, slope variation compensation must be incorporated in order to maintain a relatively constant extinction ratio of the transmitted analog optical signals.

Direct analog modulation (predistortion) techniques include amplitude modulation (AM) techniques, quadrature amplitude modulation (QAM) techniques, frequency modulation (FM) techniques, intensity modulation (IM) techniques, and the like, well known to those of ordinary skill in the art. These direct analog modulation techniques are typically applied to Fabry-Perot (FP) and distributed feedback (DFB) cavity-design lasers and have the advantage of substantially smaller bandwidth requirements than digital modulation techniques, such as digital pulse code modulation techniques and the like. External analog modulation techniques, also well known to those of ordinary skill in the art, include, for example, the use of Mach-Zehnder interferometric (MZI) modulators fabricated in the inorganic material lithium niobate and electro-absorption modulators.

As also described above, non-linearity is caused by, among other things, temperature changes, age, internal parameters, and parasitics. Thus, the directly modulated lasers must be replaced regularly, likely as often as once every few months, as performance degradation occurs. Due to their relatively high cost, this becomes an expensive proposition. This problem is exacerbated by the fact that optical network elements are continually being deployed closer to end users. Thus, these optical network elements are being deployed in uncontrolled "field" environments. Currently, the only "outside-plant" rated components are transceiver-based components for digital communications, not analog communications. Similarly, the externally modulated lasers that compensate, to some extent, for non-linearity suffer from component complexity and are also relatively expensive.

Thus, what are needed are systems and methods for real-time compensation for non-linearity in optical sources for analog signal transmission and the like that minimize component complexity. By providing a correction factor for non-linearity due to temperature changes, age, internal parameters, parasitics, and the like, these systems and methods would eliminate the need for regular laser replacement, and thereby significantly reduce cost.

As further described above, in various exemplary embodiments, the present invention provides a compact analog directly modulated laser configuration that is suitable for use in the field that uses electrical feedback to compensate for non-linearity in real time, such that no matter how the LI curve changes, the electrical feedback compensates for non-linearity by amplifying a portion of the output analog optical signal and combining it with the input analog electrical signal using the standard control method of negative feedback.

When the gain of the feedback loop is relatively high, the overall transfer function of the system is primarily dependent on the feedback loop gain block, which is substantially linear. This is accomplished by incorporating a relatively large bandwidth photo-detector at the back facet of the laser that both monitors the output power of the system and provides a feedback signal to the linearization control circuit, as well as an amplifier. The amplified signal from the relatively large bandwidth photo-detector is used to correct for various undesirable effects, such as non-linearity and relative intensity noise (RIN) of the laser. The signal from the relatively large bandwidth photo-detector also allows the laser to operate effectively close to threshold.

In general, a laser includes a cavity disposed between a front facet and a back facet. These facets are mirrors that reflect photons in the cavity. An electrical source is used to create a population inversion in the cavity, thereby creating the spontaneous emission of photons. These photons reflect between the front facet and the back facet in the cavity and encounter excited atoms, thereby producing the stimulated emission of photons. The photons created by this stimulated emission have the same direction as the spontaneously emitted photons that created them, as well as the same phase and wavelength.

A percentage of the photons exit the cavity through one of the facets, which is a mirror with partial reflectivity. Power builds in the cavity until the amount of light exiting the cavity equals the amount of energy being applied to the cavity, minus losses. Typically, in most applications, the front facet is a partially reflective mirror and the back facet is a fully reflective mirror. As described above, the electrical source used to create the population inversion in the cavity can be an analog signal that is used to modulate the resulting optical signal. Such direct modulation is relatively simple and inexpensive, as compared to external modulation. In external modulation, an external modulator is used to modulate the light from a laser. Typically, external modulation provides improved linearity performance and enhanced stability of the resulting optical signal, at the expense of component complexity and expense.

Figure 2:
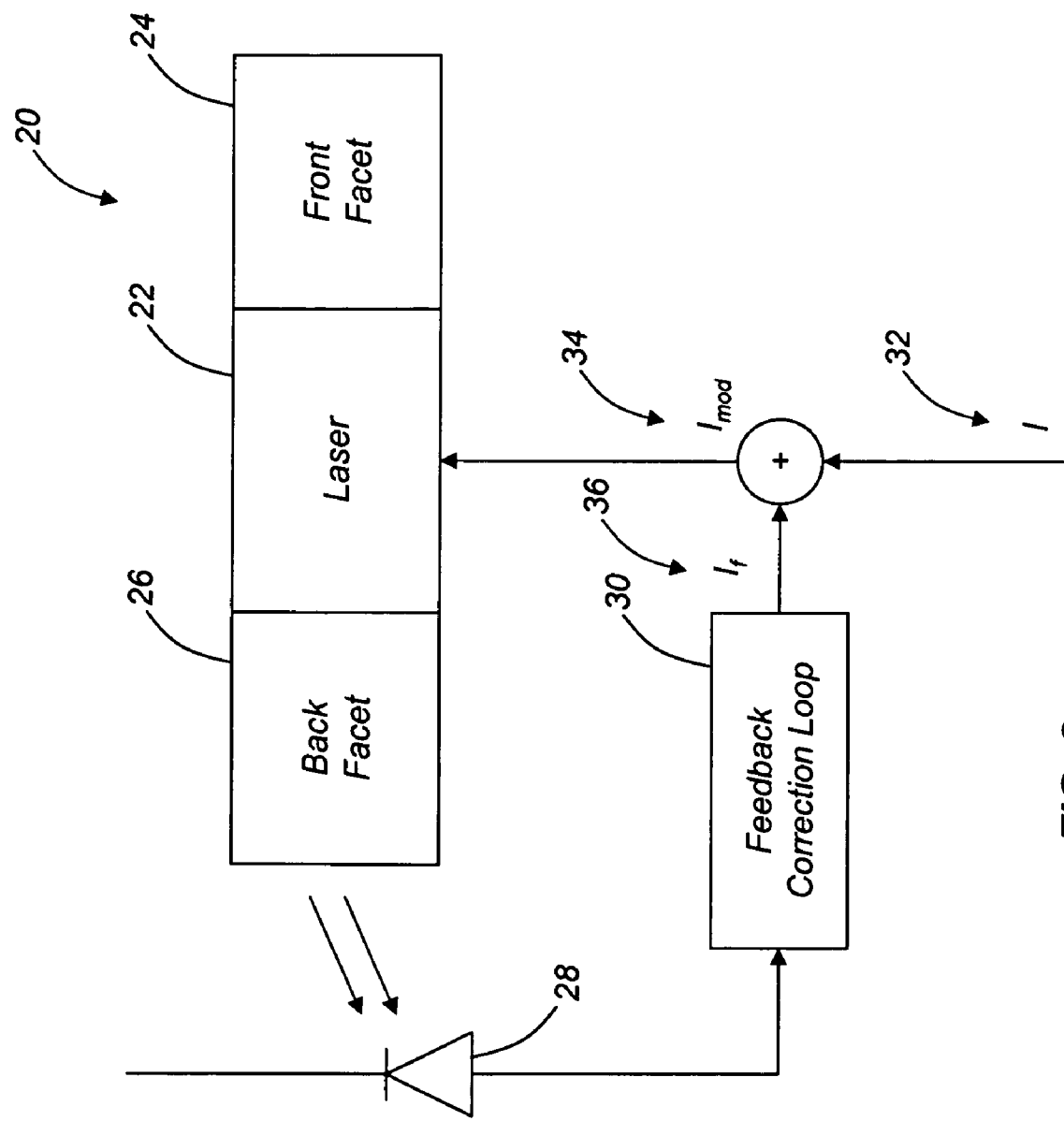
FIG. 2 is a schematic diagram illustrating one exemplary embodiment of the compact analog directly modulated laser configuration of the present invention, the compact analog directly modulated laser configuration incorporating a relatively large bandwidth photo-detector and negative feedback correction loop coupled to the back facet of the laser, providing high-gain, linear negative feedback to the input analog electrical signals.

Referring to FIG. 2, the laser configuration 20 of the present invention includes a laser 22, such as a semiconductor laser, laser diode (Fabry-Perot (FP), distributed feedback (DFB), or the like), etc., including a front facet 24 and a back facet 26. These facets 24,26 are mirrors having a predetermined reflectivity based on the desired characteristics of the laser 22. Typically, the optical output power of the laser 22 is measured via a tap and optical splitter coupled to the front facet 24 of the laser 22. This measurement approach has the disadvantage of significantly decreasing the optical output power of the laser 22, as well as adding to component bulk. Optionally, the optical output power of the laser 22 is measured via a photo-detector 28 coupled to the back facet 26 of the laser 22. In such cases, the back facet 26 of the laser 22 is a mirror with partial reflectivity. This partial reflectivity can be relatively small in degree, as the photo-detector 28 is disposed relatively close to the back facet 26 of the laser 22. For example, in a 14-pin butterfly (BFY) package commonly used in telecommunications (dense wavelength division multiplexing (DWDM)) applications, the laser diode includes a single-mode fiber pigtail, a heat sink, a thermo-electric (TE) cooler, a thermistor, and a monitor diode (photo-detector 28). The case is coupled to the laser chip via an anode and is grounded.

The laser configuration 20 of the present invention also includes a feedback correction loop 30 coupled to the photo-detector 28. The input analog electrical current 32 (I) of the laser is modulated, resulting in modulation analog electrical current 34 ($I_{mod}$), which is modified by feedback analog electrical current 36 ($I_f$). Advantageously, if the laser transfer function=X, the feedback correction loop transfer function=Y, the overall system transfer function=Z, Z=X/(1+XY), and Y, being, by nature, substantially linear, is amplified such that Y>>1, then Z=1/Y and is substantially linear. Therefore, non-linearity of the LI curve is effectively compensated for.

Figure 3:
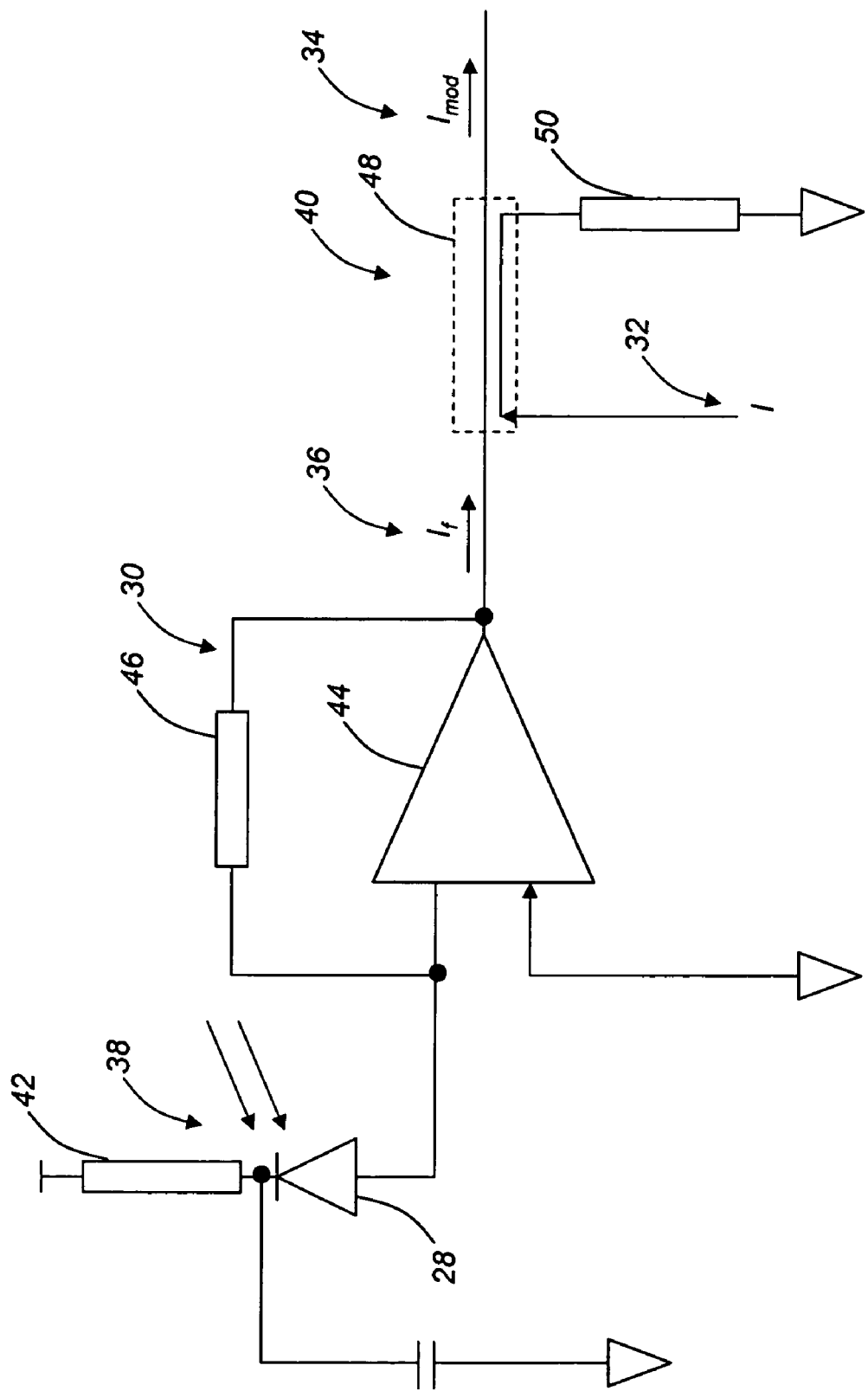
FIG. 3 is a schematic diagram illustrating one exemplary embodiment of the negative feedback correction loop of FIG. 2.

Referring to FIG. 3, preferably, the feedback correction loop 30 is a negative (180-degree inversion) feedback correction loop, although other suitable feedback correction loops can be used. In general, for purposes of illustration, the photo-detector assembly 38, the feedback correction loop 30, and the linearization control circuit 40 include the photo-detector 28 and a resistor 42, a transimpedance amplifier 44 (TIA) and a feedback resistor 46 ($R_f$), and a radio frequency (RF) combiner 48 and a resistor 50 (such as a 50 ohm resistor or the like), respectively. The photo-detector assembly 38, disposed at the back facet 26 (FIG. 2) of the laser 22 (FIG. 2), and the feedback correction loop 30 provide the feedback analog electrical current 36 ($I_f$) to the linearization control circuit 40, where the feedback analog electrical current 36 ($I_f$) is combined with the input analog electrical current 32 (I) to form the modulation analog electrical current 34 ($I_{mod}$), which modulates the laser 22. As described above, the output of the transimpedance amplifier 44 (TIA) is 180 degrees out-of-phase with the input.

Referring again to FIG. 2, preferably, the back facet 26 of the laser 22 incorporates a relatively large bandwidth photo-detector 28 that both monitors the optical output power of the system (as is done with conventional systems) and provides a feedback signal to the linearization control circuit 40 (FIG. 3). For example, a 2.5 GHz bandwidth photo-detector 28 is used for the transmission of a 2.5 GHz analog optical signal, a 10 GHz bandwidth photo-detector 28 is used for the transmission of a 10 GHz analog optical signal, etc. Thus, the photodiode specification (and the specification of each system component, including the laser 22) is carefully selected such that it coincides with the desired rate (signal frequency).

The use of this relatively large bandwidth photo-detector 28 at the back facet 26 of the laser 22 for providing a feedback signal to the linearization control circuit is novel and has been rejected by conventional systems and methods. For example, U.S. Pat. No. 5,311,005, issued to Visocchi on May 10, 1994, states:

Compensation of the slope variation of a laser diode due to temperature and/or time is thus achieved without the use of low frequency ripple or peak detection, rather the a.c. and mean optical powers are compared in order to obtain the optimum optical extinction ratio. The a.c. optical signal power is used to indicate a reduction in slope efficiency.

The description above refers to laser diodes for use in optical fibre transmission systems. There is, however, growing interest in optical microwave subcarrier communications and transmitters therefore, which would also employ laser diodes and require slope variation compensation. The arrangement described above with reference to FIG. 1 is not suitable for such microwave applications without modification. This is due to the limited bandwidth of the back facet photodiode 12 and the problem is enhanced as the bit rate increases. If the overall optical transmitter were to be employed as an analogue transmitter where a small microwave signal was modulated on the linear portion of the laser diode characteristic, a conventional back facet photodiode would not be usable.

However, a fibre optical coupler 30 can be arranged at the laser diode output as indicated in FIG. 3 so as to split off a small proportion of the output signal and apply it to a very high frequency microwave PIN photodiode 32, for example a 30 GHz device, and the slope may be very accurately compensated as a result. The remainder of the laser diode optical output is available from the coupler 30 at output 34. The output of PIN photodiode 32 is applied to two loops as before. The d.c. information is applied to loop 1 including a low pass filter 34 and compared with a reference voltage Vr1 used to set the d.c. (mean power) operating point. The resultant error signal ΔV1 is applied to a transconductance amplifier 36 to produce bias current Ib' which is low pass filtered at 38 and the resultant bias current Ib applied to the laser diode 10.

Relative intensity noise (RIN) of the laser is reduced using the systems and methods (and the feedback correction loop) of the present invention as demonstrated by experimental measurement of the signal-to-noise ratio (SNR) at a given laser output power with and without the feedback correction loop present. SNR is significantly higher with the feedback correction loop present and, as SNR=m/RIN, where m=the modulation index of the signal, and is a fixed value, RIN is significantly lower.

Although the present invention has been illustrated and described herein with reference to preferred embodiments and specific examples thereof, it will be readily apparent to those of ordinary skill in the art that other embodiments and examples can perform similar functions and/or achieve like results. All such equivalent embodiments and examples are within the spirit and scope of the invention and are intended to be covered by the following claims.

What is claimed is:

1. A system for real-time compensation for non-linearity in an optical source for analog signal transmission, comprising:
    a laser device comprising a front facet and a back facet, wherein the laser device is operable for receiving an analog modulated input current and generating an analog optical output signal comprising a direct analog modulation technique of an analog signal transmission;
    a photo-detector device disposed adjacent to the back facet of the laser device, wherein the photo-detector device is operable for measuring the optical output power of the laser device, and wherein the bandwidth of the photo-detector device substantially corresponds to all of the bandwidth of the analog optical output signal with the direct analog modulation technique of the analog signal transmission; and
    a feedback correction loop coupled to the photo-detector device, wherein the feedback correction loop is operable for generating a substantially linear feedback current responsive only to the optical output power measured for all of the bandwidth of the analog optical output signal;
    wherein an input analog current is modified in real-time by the substantially linear feedback current to form the analog modulated input current such that the analog optical output signal closely matches the input current without significant distortion in the analog signal transmission.

2. The system of claim 1, wherein the back facet comprises a partially reflective mirror.

3. The system of claim 1, wherein the modulated input current comprises a substantially linear modulated input current.

4. The system of claim 1, wherein the photo-detector device comprises a photo-detector device comprising a bandwidth of between about 100 MHz and about 20 GHz.

5. The system of claim 1, wherein the feedback correction loop comprises a negative feedback correction loop.

6. The system of claim 1, wherein the feedback correction loop comprises a transimpedance amplifier, a feedback resistor, and a radio frequency (RF) combiner.

7. The system of claim 1, wherein a gain of the input current is about 0 dB, a gain of the substantially linear feedback current is about 60 dB (electrical gain), and a gain of the modulated input current is about 0 dB.

8. The system of claim 1, wherein, if a laser device transfer function=X, a feedback correction loop transfer function=Y, an overall system transfer function=Z, Z=X/(1+XY), and Y, being, by nature, substantially linear, is amplified such that Y>>1, then Z=1/Y and is substantially linear.

9. The system of claim 1, wherein the laser device comprises one of a semiconductor laser and a laser diode.

10. The system of claim 1, wherein the feedback correction loop comprises only analog electronic devices, and wherein the feedback correction loop comprises no memory storage devices.

11. A method for real-time compensation for non-linearity in an optical source for analog signal transmission, comprising:
    providing a laser device comprising a front facet and a back facet, wherein the laser device is operable for receiving an analog modulated input current and generating an analog optical output signal comprising a direct analog modulation technique of an analog signal transmission;
    providing a photo-detector device disposed adjacent to the back facet of the laser device, wherein the photo-detector device is operable for measuring the optical output power of the laser device, and wherein the bandwidth of the photo-detector device substantially corresponds to all of the bandwidth of the analog optical output signal with the direct analog modulation technique of the analog signal transmission; and
    providing a feedback correction loop coupled to the photo-detector device, wherein the feedback correction loop is operable for generating a substantially linear feedback current responsive only to the optical output power measured for all of the bandwidth of the analog optical output signal;
    wherein an input analog current is modified in real-time by the substantially linear feedback current to form the analog modulated input current such that the analog optical output signal closely matches the input current without significant distortion in the analog signal transmission.

12. The method of claim 11, wherein the back facet comprises a partially reflective mirror.

13. The method of claim 11, wherein the modulated input current comprises a substantially linear modulated input current.

14. The method of claim 11, wherein the photo-detector device comprises a photo-detector device comprising a bandwidth of between about 100 MHz and about 20 GHz.

15. The method of claim 11, wherein the feedback correction loop comprises a negative feedback correction loop.

16. The method of claim 11, wherein the feedback correction loop comprises a transimpedance amplifier, a feedback resistor, and a radio frequency (RF) combiner.

17. The method of claim 11, wherein a gain of the input current is about 0 dB, a gain of the substantially linear feedback current is about 60 dB (electrical gain), and a gain of the modulated input current is about 0 dB.

18. The method of claim 11, wherein, if a laser device transfer function=X, a feedback correction loop transfer function=Y, an overall system transfer function=Z, Z=X/(1+XY), and Y, being, by nature, substantially linear, is amplified such that Y >>1, then Z=1/Y and is substantially linear.

19. The method of claim 11, wherein the laser device comprises one of a semiconductor laser and a laser diode.

20. The method of claim 11, wherein the feedback correction loop comprises only analog electronic devices, and wherein the feedback correction loop comprises no memory storage devices.

21. A method for real-time compensation for non-linearity in an optical source for analog signal transmission, comprising:
receiving an input analog current for modulating a laser device, wherein the laser device is configured to produce an analog optical signal;
monitoring a back facet of the laser device with a photo-detector device, wherein a bandwidth of the photo-detector device comprises substantially all of a bandwidth of the analog optical signal;
generating a substantially linear feedback current with a feedback correction loop responsive to the monitoring, wherein the substantially linear feedback current is responsive only to the optical output power measured for all of the bandwidth of the analog optical output signal;
providing a modulated input current to the laser device, wherein the modulated input current comprises a combination of the input analog signal and the substantially linear feedback current;
wherein the modulated input current comprises an input current having a relatively low gain and a substantially linear feedback current having a relatively high gain; and
wherein the modulated input current is used to compensate in real-time for relative intensity noise (RIN) associated with the analog optical output signal comprising a direct analog modulation technique, and the modulated input current is formed such that the analog optical output signal closely matches the input current without significant distortion.

22. The method of claim 21, wherein the feedback correction loop comprises a negative feedback correction loop.

23. The method of claim 21, wherein the feedback correction loop comprises a transimpedance amplifier, a feedback resistor, and a radio frequency (RF) combiner.

24. The method of claim 21, wherein the gain of the input current is about 0 dB and the gain of the substantially linear feedback current is about 60 dB (electrical gain).

25. The method of claim 21, wherein the feedback correction loop comprises only analog electronic devices, wherein the feedback correction loop comprises no memory storage devices, and wherein the feedback correction loop requires no setup parameters.

* * * * *